United States Patent
Gotterba et al.

(10) Patent No.: US 8,804,437 B2
(45) Date of Patent: Aug. 12, 2014

(54) COLUMN SELECT MULTIPLEXER AND METHOD FOR STATIC RANDOM-ACCESS MEMORY AND COMPUTER MEMORY SUBSYSTEM EMPLOYING THE SAME

(71) Applicant: Nvidia Corporation, Santa Clara, CA (US)

(72) Inventors: Andreas Gotterba, Santa Clara, CA (US); Joel DeWitt, Campbell, CA (US); Marek Smoszna, Campbell, CA (US)

(73) Assignee: Nvidia Corporation, Santa Clara, CA (US)

( * ) Notice: Subject to any disclaimer, the term of this patent is extended or adjusted under 35 U.S.C. 154(b) by 15 days.

(21) Appl. No.: 13/626,090

(22) Filed: Sep. 25, 2012

(65) Prior Publication Data

US 2014/0085965 A1   Mar. 27, 2014

(51) Int. Cl.
  *G11C 7/10* (2006.01)
(52) U.S. Cl.
  USPC .................. 365/189.02; 365/230.02

(58) Field of Classification Search
  USPC .................................................. 365/189.02
  See application file for complete search history.

(56) References Cited

U.S. PATENT DOCUMENTS

| | | | |
|---|---|---|---|
| 6,222,777 B1 * | 4/2001 | Khieu ....................... | 365/189.02 |
| 6,292,401 B1 * | 9/2001 | Zhang et al. ............. | 365/189.02 |
| 7,394,681 B1 * | 7/2008 | Masleid ........................ | 365/154 |
| 7,477,551 B2 * | 1/2009 | Avramescu et al. ..... | 365/189.02 |
| 8,085,580 B2 * | 12/2011 | Mehta ........................... | 365/154 |

* cited by examiner

*Primary Examiner* — Son Mai

(57) ABSTRACT

A column select multiplexer, a method of reading data from a random-access memory and a memory subsystem incorporating the multiplexer or the method. In one embodiment, the column select multiplexer includes: (1) a first field-effect transistor having a gate coupled via an inverter to a bitline of a static random-access memory array, (2) a second field-effect transistor coupled in series with the first field-effect transistor and having a gate coupled to a column select bus of the static random-access memory array and (3) a latch having an input coupled to the first and second field-effect transistors.

18 Claims, 3 Drawing Sheets

COLUMN SELECT MULTIPLEXER AND METHOD FOR STATIC RANDOM-ACCESS MEMORY AND COMPUTER MEMORY SUBSYSTEM EMPLOYING THE SAME

TECHNICAL FIELD

This application is directed, in general, to computer memory subsystems including random-access memory (RAM) and, more specifically, to a column select multiplexer for static random-access memory (SRAM).

BACKGROUND

SRAM has long been a popular choice for use as fast memory. For this reason, SRAM is often used as cache memory in computer systems, e.g., personal computers (PCs) and workstations. SRAM is markedly faster than dynamic random-access memory (DRAM), because it does not need to be refreshed, and dramatically faster than a hard drive, because reading from it does not require mechanical action.

Various approaches have been undertaken to increase SRAM speed. One approach involves improving memory bitcell switching speed. Another approach involves employing current sensing for large SRAM arrays. Yet another approach involves precharging bit lines to a level lower than $V_{DD}$. All of these techniques hold promise.

SUMMARY

One aspect provides a column select multiplexer. In one embodiment, the column select multiplexer includes: (1) a first switch having a gate coupled via an inverter to a bitline of an SRAM array, (2) a second switch coupled in series with the first switch and having a gate coupled to a column select bus of the SRAM array and (3) a latch having an input coupled to the first and second switches.

Another aspect provides a method of reading data from a bitcell of an SRAM array. In one embodiment, the method includes: (1) providing an inverted value in the bitcell to a gate of a first field-effect transistor, (2) providing a column select signal to a gate of a second field-effect transistor coupled in series with the first field-effect transistor and (3) employing the first and second field-effect transistors to impress a logical zero on an input of a latch only when the first and second field-effect transistors are ON.

Yet another aspect provides a memory subsystem. In one embodiment, the memory subsystem includes: (1) a memory controller, (2) a first RAM array coupled to the memory controller, (3) a second RAM array coupled to the memory controller and (4) a column select multiplexer coupled to the first SRAM array and the second RAM array. In one embodiment, the column select multiplexer has: (1) a first switch having a gate coupled to a bitline of the first RAM array, (2) a second switch coupled in series with the first switch and having a gate coupled to a column select bus of the RAM array and (3) a latch having an input coupled to the first and second switches.

BRIEF DESCRIPTION

Reference is now made to the following descriptions taken in conjunction with the accompanying drawings, in which.

DETAILED DESCRIPTION

Figure 1:
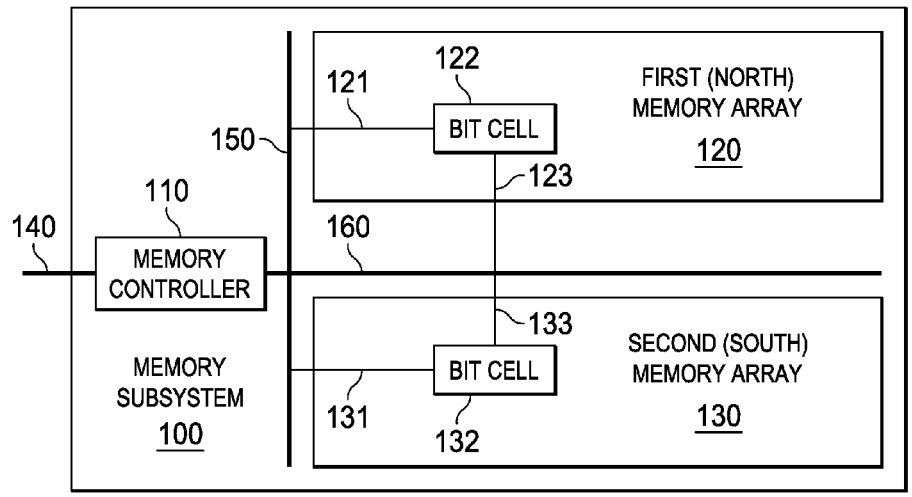
FIG. 1 is a block diagram of one embodiment of a memory subsystem containing SRAM having at least one column select multiplexer.

As stated above, SRAM has significantly enhanced memory speed for higher-performance PCs and other computer systems. As a result, significant work has been done to improve various aspect of its design to enhance its speed.

However, it is realized herein that memory bitcell switching speed, the manner in which bit values are sensed and the level at which bit lines are precharged are not the only sources of memory delays. The circuitry responsible for reading data from the memory bitcells introduces its own delay.

As those skilled in the pertinent art are familiar, while a row of memory bitcells is activated at the same time, only one bitcell in the row is actually intended to be read. Accordingly, a column select multiplexer is employed to receive data from each of the bitcells in a row and provide data from one of the bitcells as an output based on a column select signal also received by the column select multiplexer.

A conventional column select multiplexer typically uses n-channel metal-oxide semiconductor (NMOS) field-effect transistor (FET) passgates to convey data from bitlines providing its inputs to its output. A column select signal is provided to the gate of the FET, and the data is provided to its source. The FET, which switches in response to the column select signal, passes the data to its drain.

It is realized herein that passgates are relatively slow to transmit and consequently that the speed of a column select multiplexer may be increased by employing circuitry that switches faster than passgates. It is further realized that a faster column select multiplexer would be of significant benefit not only in conjunction with SRAM, but RAM in general.

Conventional attempts at mitigating the delay caused by passgates involved feeding bitlines directly into a cascading tree of logic gates. While this approach reduced the time constant associated with passgates, the required tree of logic gates lengthened the critical path through which data must be read and typically required substantial IC area to implement, especially for column select multiplexers having a large number of inputs. It was large, but expensive in terms of area, and ultimately undesirable.

What is needed is a fundamentally different column select multiplexer topology that not only avoids passgates but cascading trees of (typically complementary metal-oxide semiconductor, or CMOS) logic gates. Accordingly, introduced herein are various embodiments of a column select multiplexer and a method of reading data from RAM, including SRAM. In general, the embodiments of the column select multiplexer introduced herein employ NMOS FETs, but instead use the bitlines (via inverters) to drive the gates of the FETs. In a manner that will be understood with reference to the embodiments specifically illustrated and described herein, the gate-driven FETs are capable of switching more quickly than passgates, and therefore that the novel column select multiplexer provides a faster way to read data from SRAM. The method embodiments display similar read-speed increases.

Also described herein are various embodiments of a memory subsystem that exhibits faster read times by virtue of its use of embodiments of the novel column select multiplexer or method disclosed herein.

FIG. 1 is a block diagram of one embodiment of a memory subsystem 100 containing SRAM having at least one column select multiplexer (not shown). The memory subsystem 100 includes a memory controller 110, a first memory array 120 and a second memory array 130. The first and second memory arrays 120, 130 include bitcells arranged in rows and columns and configured to hold one bit of data per bitcell. FIG. 1 shows only one bitcell 122, 132 in each of the first and second memory arrays 120, 130. Corresponding wordlines 121, 131 allow the rows containing the bitcells 122, 132 to be addressed (written or read), and corresponding bitlines 123, 133 allow the bitcells 122, 123 to be addressed (written or read). The memory controller 110 is configured, among other things, to write data to, and read data from, the first and second memory arrays 120, 130. Accordingly, the memory controller 110 is configured to translate memory addresses received (e.g., via a bus 140) into row and column select signals for the first and second memory arrays. The memory controller 110 then communicates the row and column select signals via one or more row buses 150 and one or more column buses 160.

In the illustrated embodiment, the row select signals are employed to select a row in the first or second memory array 120, 130 by using wordlines (including the wordlines 121, 131). This enables, as described above, an entire row of bitcells (containing a word of data) to be read from the first or second memory arrays 120, 130. The word is provided on bit lines (including the bitlines 123, 133) respectively associated with the rows of bitcells. Then column select signals are employed to select among the bit lines the one containing the data to be returned through the memory controller 110 to other computer system components, such as a processor (not shown). In the illustrated embodiment, it is the speed at which data is transferred from bitcells to the output of the memory subsystem 100 that is desired to be increased.

In an alternative embodiment, an entire column is first read, and a row select multiplexer is then employed to select among the columns in the selected row the data that is returned to the memory controller 110. Those skilled in the art should understand not only that the function carried out by the row select multiplexer in the alternative embodiment is the same as that carried out by the column select multiplexer in the illustrated embodiment, but in fact that the terms "column" and "row" are relative terms and depend upon the orientation of the memory array. Thus, those skilled in the pertinent art will understand that a column select multiplexer can also function as a row select multiplexer without departing from the scope of the invention.

Having described an embodiment of a memory subsystem, a column select multiplexer suitable for use with the memory subsystem will now be described. Since the memory subsystem 100 happens to have two arrays, namely the first and second memory arrays 120, 130, the column select multiplexer is configured to work with both arrays. For purposes of describing FIG. 2, the first memory array will be referred to as a north memory array, and the second memory array will be referred to as a south memory array.

Figure 2:
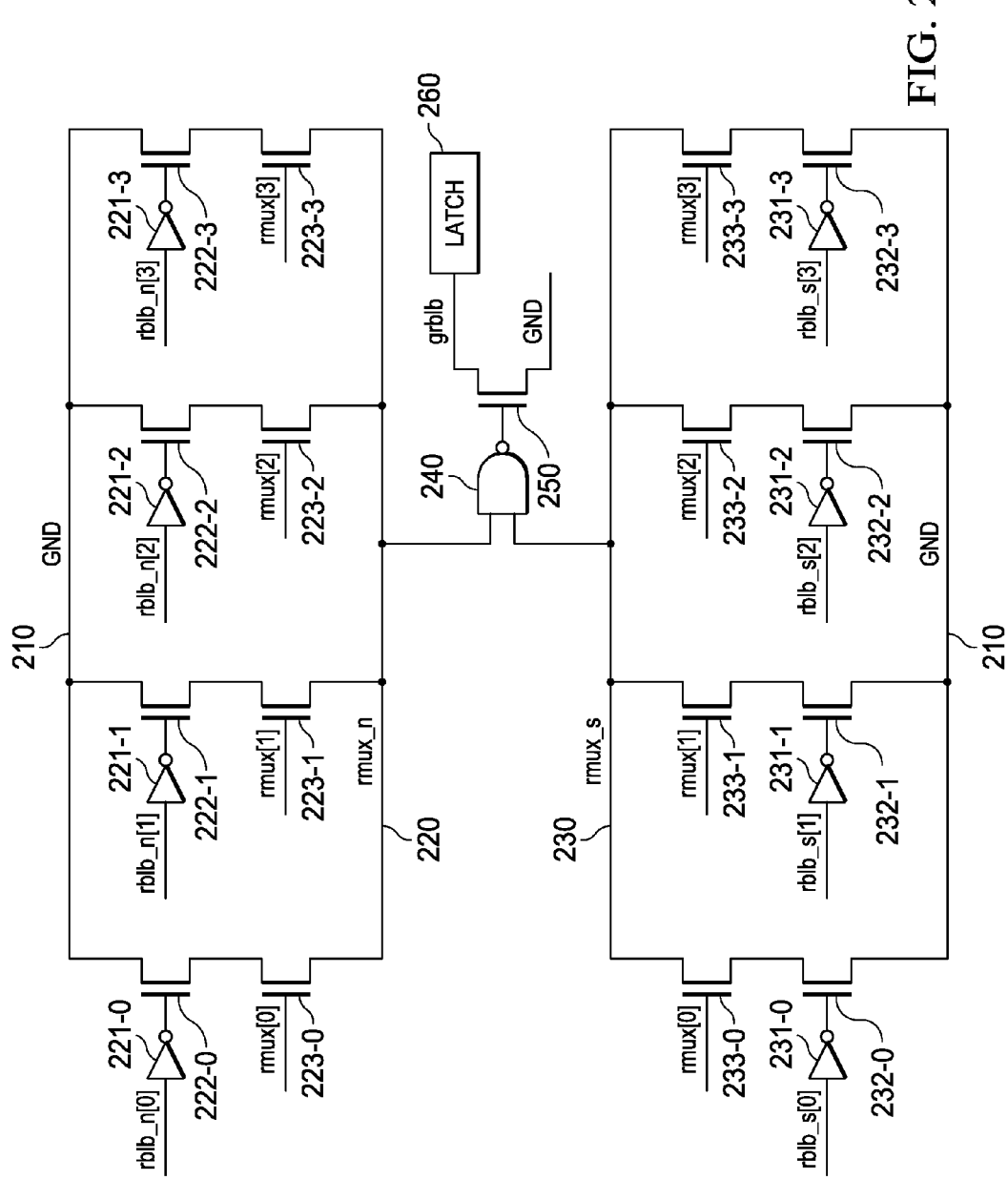
FIG. 2 is a hybrid block/schematic diagram of one embodiment of a column select multiplexer employable with SRAM.

FIG. 2 is a hybrid block/schematic diagram of one embodiment of a column select multiplexer employable with SRAM. In FIG. 2, the SRAM takes the form of the first and second memory arrays 120, 130 of FIG. 1, which will now be referred to as the north and south memory arrays.

The column select multiplexer has a first section corresponding to the north memory array and a second section corresponding to the south memory array. FIG. 2 shows only a portion of the first and second sections corresponding to only four columns of the north and south memory arrays. Accordingly, the first section includes:

(1) a portion corresponding to a column 0 of the north memory array and having an inverter 221-0 coupled to a gate of a bitline FET 222-0 (e.g., an NMOS FET) and a column select FET 223-0 (e.g., an NMOS FET) coupled in series with the bitline FET 222-0 between ground GND 210 and a multiplexer north output read line rmux_n 220. A bitline rblb_n[0] is coupled to the input of the inverter 221-0, and a column select line rmux[0] is coupled to the gate of the column select FET 223-0.

(2) a portion corresponding to a column 1 of the north memory array and having an inverter 221-1 coupled to a gate of a bitline FET 222-1 and a column select FET 223-1 coupled in series with the bitline FET 222-1 between the ground GND 210 and the multiplexer north output read line rmux_n 220. A bitline rblb_n[1] is coupled to the input of the inverter 221-1, and a column select line rmux[1] mux[1] is coupled to the gate of the column select FET 223-1.

(3) a portion corresponding to a column 2 of the north memory array and having an inverter 221-2 coupled to a gate of a bitline FET 222-2 and a column select FET 223-2 coupled in series with the bitline FET 222-2 between the ground GND 210 and the multiplexer north output read line rmux_n 220. A bitline rblb_n[2] is coupled to the input of the inverter 221-2, and a column select line rmux[2] is coupled to the gate of the column select FET 223-2.

(4) a portion corresponding to a column 3 of the north memory array and having an inverter 221-3 coupled to a gate of a bitline FET 222-3 and a column select FET 223-3 coupled in series with the bitline FET 222-3 between the ground GND 210 and the multiplexer north output read line rmux_n 220. A bitline rblb_n[3] is coupled to the input of the inverter 221-3, and a column select line rmux[3] is coupled to the gate of the column select FET 223-3.

Likewise, the second section includes:

(1) a portion corresponding to a column 0 of the south memory array and having an inverter 231-0 coupled to a gate of a bitline FET 232-0 and a column select FET 233-0 coupled in series with the bitline FET 232-0 between the ground GND 210 and a multiplexer south output read line rmux_s 230. A bitline rblb_s[0] is coupled to the input of the inverter 231-0, and the column select line rmux[0] is also coupled to the gate of the column select FET 233-0.

(2) a portion corresponding to a column 1 of the south memory array and having an inverter 231-1 coupled to a gate of a bitline FET 232-1 and a column select FET 233-1 coupled in series with the bitline FET 232-1 between the ground GND 210 and the multiplexer south output read line rmux_s 230. A bitline rblb_s[1] is coupled to the input of the inverter 231-1, and the column select line rmux[1] is also coupled to the gate of the column select FET 233-1.

(3) a portion corresponding to a column 2 of the south memory array and having an inverter 231-2 coupled to a gate of a bitline FET 232-2 and a column select FET 233-2 coupled in series with the bitline FET 232-2 between the ground GND 210 and the multiplexer south output read line rmux_s 230. A bitline rblb_s[2] is coupled to the input of the inverter 231-2, and the column select line rmux[2] is also coupled to the gate of the column select FET 233-2.

(4) a portion corresponding to a column 3 of the south memory array and having an inverter 231-3 coupled to a gate of a bitline FET 232-3 and a column select FET 233-3 coupled in series with the bitline FET 232-3 between the ground GND 210 and the multiplexer south output read line rmux_s 230. A bitline rblb_s[3] is coupled to the input of the inverter 231-3, and the column select line rmux[3] is also coupled to the gate of the column select FET 233-3.

The multiplexer north and south output read lines rmux_n and rmux_s 220, 230 are coupled to respective inputs of a NAND gate 240. The output of the NAND gate is coupled to the gate of a FET 250 coupled between the input of a latch 260 and a ground GND.

In the embodiment of FIG. 2, the multiplexer north and south output read lines rmux_n and rmux_s 220, 230, as well as the bitlines (e.g., the bitlines rblb_n[0], rblb_n[1], rblb_n[2], rblb_n[3], rblb_s[0], rblb_s[1], rblb_s[2] and rblb_s[3]) are precharged to a logical one and then either caused to remain at the logical one or discharged to a logical zero depending upon the state of the bit being read from a particular bitcell. FIG. 2 does not show precharge circuitry configured to precharge the multiplexer north and south output read lines rmux_n and rmux_s 220, 230. However, one embodiment of precharge circuitry will be shown in FIG. 3 and described in conjunction therewith.

The operation of the column select multiplexer of FIG. 2 will now be illustrated by example. In the example, it will be assumed that the bit stored in column 0 of the north memory array is desired to be read. Accordingly, the multiplexer north output read line rmux_n 220, the multiplexer south output read line rmux_s 230 and the bitlines for the north memory array, including rblb_n[0], rblb_n[1], rblb_n[2] and rblb_n[3], are precharged to a logical one. A row select signal is asserted, causing the bits constituting a word stored in a particular row of the north memory array to be impressed on the bitlines associated with the bitcells in the row. Accordingly, the bitlines rblb_n[0], rblb_n[1], rblb_n[2] and rblb_n[3], are caused to assume the values associated with the bitcells with which they are associated (either leaving the bitlines charged to a logical one or discharged to a logical zero as the case may be).

It will be assumed that the bit stored in column 0 of the north memory array is a logical zero. Accordingly, the bitline rblb_n[0] is discharged to a logical zero. The logical zero is provided to the inverter 221-0, which causes its output to be a logical one. The logical one is provided to the gate of the bitline FET 222-0. Other logical levels are provided to the gates of the other bitline FETs 222-1, 222-2, 222-3.

A column select signal is concurrently provided (e.g., from the one or more column buses 160 of FIG. 1) to the gate of the column select FET 223-0. Because column 0 is the column desired to be read, the column select signal is a logical one. Other column select signals are provided to the gates of the other column select FETs 223-1, 223-2, 223-3. Those column select signals are all logical zeroes.

Accordingly, the bitline FET 222-0 and the column select FET 223-0 are turned ON (closed, or conducting). This causes the multiplexer north output read line rmux_n 220 to be grounded, impressing a logical zero on it. At the same time, precharging has not occurred with respect to the south memory array bitlines. Furthermore, either column select signals for the south memory array are all at a logical zero or no row select signal is asserted in the south memory array. Thus the multiplexer south output read line rmux_s 230 remains precharged at a logical one. As a result, the multiplexer north output read line rmux_n 220 impress a logical zero on an upper input of the NAND gate 240, and the multiplexer south output read line rmux_s 230 impresses a logical one on a lower input of the NAND gate 240. In accordance with its logic, the NAND gate 240 provides a logical one at its output and to the gate of the FET 250, which is an NMOS FET in the illustrated embodiment. The FET turns ON (closed, or conducting), grounding the input of the latch 260, causing the latch 260 to provide a logical zero at its output.

It is apparent that were the bit stored in column 0 of the north memory array a logical one, the bitline FET 222-0 would remain OFF. Consequently, the multiplexer north output read line rmux_n 220 would remain at a logical one, both inputs of the NAND gate 240 would be at a logical one, the output of the NAND gate 240 would be a logical zero, the FET 250 would stay OFF, isolating the input of the latch 260 from ground and causing the latch 260 to provide a logical one at its output.

Figure 3:
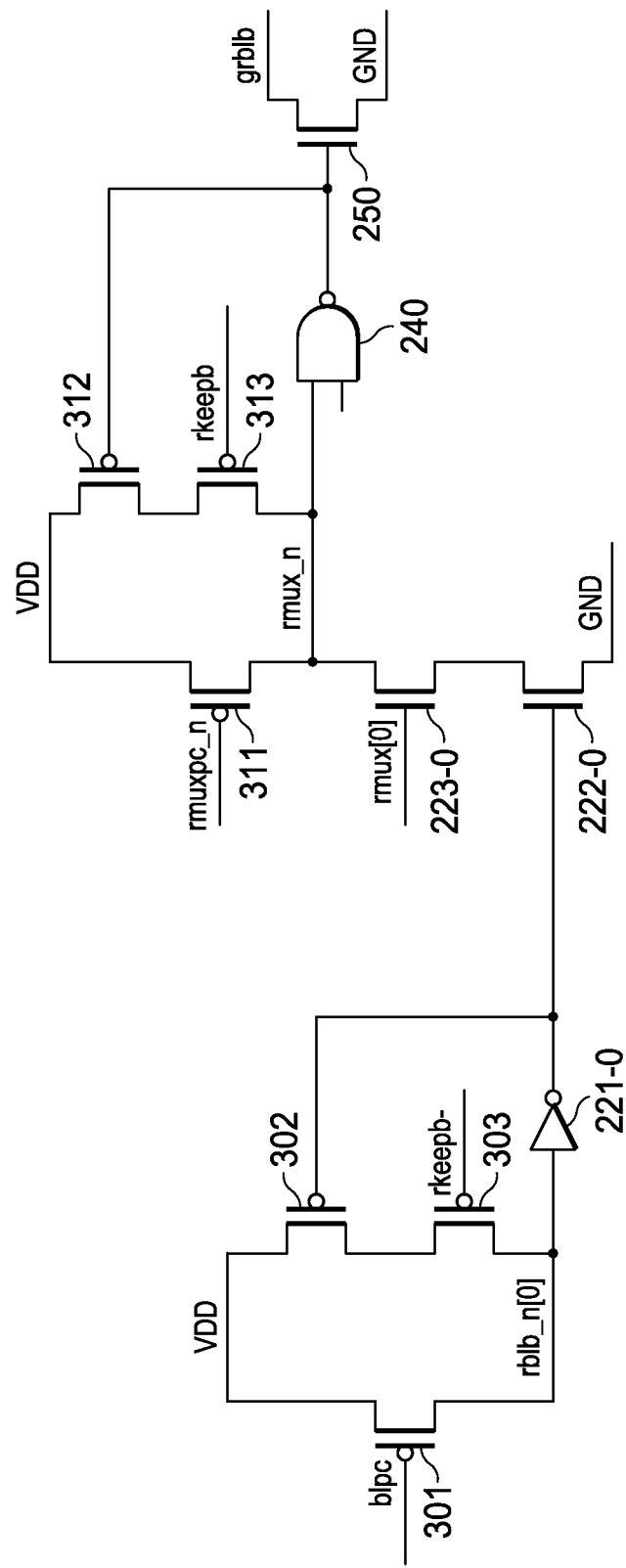
FIG. 3 is a schematic diagram of one embodiment of precharge circuitry associated with the column select multiplexer of FIG. 2.

FIG. 3 is a schematic diagram of one embodiment of precharge circuitry associated with the column select multiplexer of FIG. 2. FIG. 3 shows only the precharge circuitry associated with one column of one section of the column select multiplexer of FIG. 2, specifically, column 0 of the first section (corresponding to the north memory array). A precharge FET 301 coupled to VDD turns ON in response to a precharge signal blpc to precharge the bitline rblb_n[0]. In the illustrated embodiment, the precharge FET 301 is a PMOS FET. Series-coupled feedback and keeper FETs 302, 303 also coupled to VDD turn ON in response to a signal from the output of the inverter 221-0 and a keeper signal rkeepb to latch the precharge provided by the precharge FET 301. In the illustrated embodiment, the feedback and keeper FETs 302, 303 are PMOS FETs.

A precharge FET 311 coupled to VDD turns ON in response to a precharge signal (e.g., rmuxpc_n) to precharge the multiplexer north output read line rmux_n 220. In the illustrated embodiment, the precharge FET 311 is a PMOS FET. Series-coupled feedback and keeper FETs 312, 313 also coupled to VDD turn ON in response to a signal from the output of the NAND gate 240 and the keeper signal rkeepb to latch the precharge provided by the precharge FET 311. In the illustrated embodiment, the feedback and keeper FETs 312, 313 are PMOS FETs.

Figure 4:
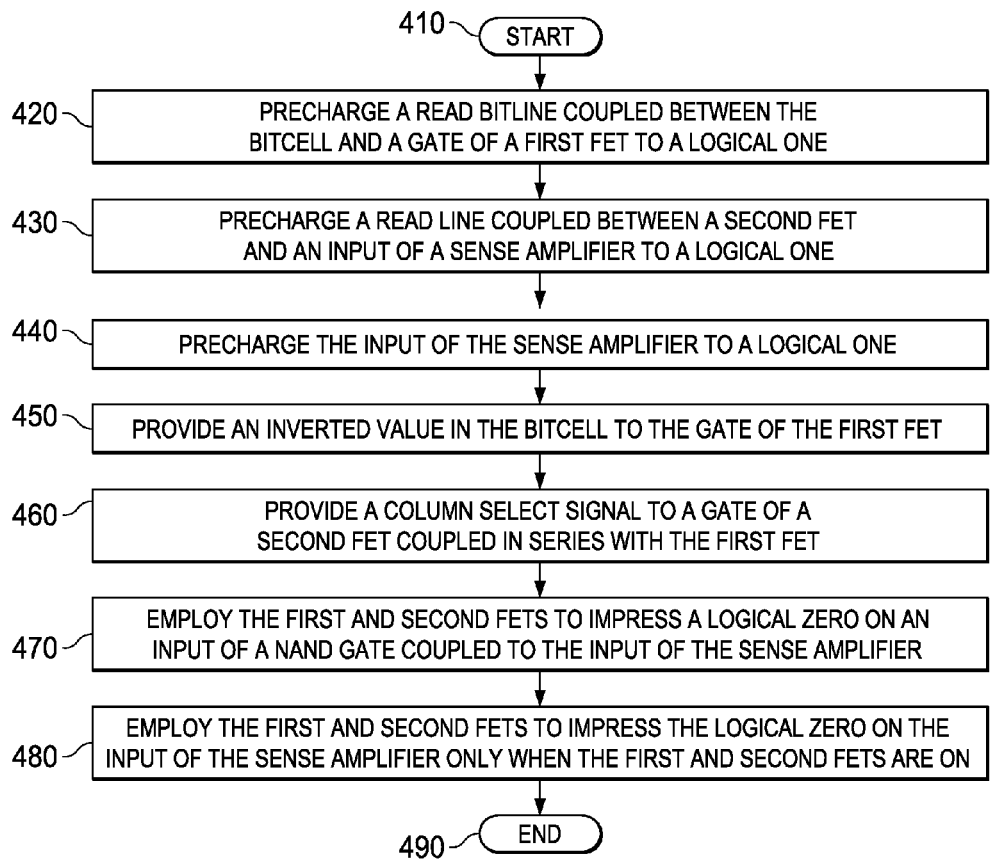
FIG. 4 is a flow diagram of one embodiment of a method of reading data from a bitcell of a SRAM array.

FIG. 4 is a flow diagram of one embodiment of a method of reading data from SRAM. The method begins in a start step 410, when it is desired to read a bitcell in a memory array. In a step 420, a bitline coupled between the bitcell and a gate of a first FET is precharged to a logical one. In a step 430, a read line coupled between a second FET and an input of a latch is precharged to a logical one. In a step 440, the input of the latch is precharged to a logical one.

In a step 450, an inverted value in the bitcell is provided to the gate of the first FET. In one embodiment, the providing of the step 450 includes inverting the value. In a step 460, a column select signal is provided to a gate of a second FET coupled in series with the first FET. In a step 470, the first and second FETs are employed to impress a logical zero on an input of a NAND gate coupled to the input of the latch. In a step 480, the first and second FETs are further employed (via the NAND gate) to impress the logical zero on an input of a latch only when the first and second FETs are ON. The method ends in an end step 490.

It should be noted that the steps of the above method may be carried out concurrently or in any order. For example, the steps 420, 430, 440 may be carried out concurrently, and the step 460 may be carried out after or before the step 450. These are but examples of alternative embodiments.

The circuit and method embodiments described above appear to be approximately 33% faster, measured from the wordline to the output of the latch, than a conventional passgate-based multiplexer. This speed improvement is significant. However, the magnitude of the improvement in speed is likely to vary somewhat depending upon the complexity of the SRAM architecture, manufacturing and operating conditions and bitline length.

Those skilled in the art to which this application relates will appreciate that other and further additions, deletions, substitutions and modifications may be made to the described embodiments.

What is claimed is:

1. A column select multiplexer, comprising:
   a first field-effect transistor having a gate coupled via an inverter of said column select multiplexer to a bitline of a random-access memory array;
   a second field-effect transistor coupled in series with said first field-effect transistor and having a gate coupled to a column select bus of said random-access memory array; and
   a latch having an input coupled to said first and second field-effect transistors, wherein said inverter is not part of said latch.

2. The column select multiplexer as recited in claim 1 further comprising a NAND gate coupled to said second field-effect transistor.

3. The column select multiplexer as recited in claim 2 further comprising a field-effect transistor coupled between said NAND gate and said latch.

4. The column select multiplexer as recited in claim 1 further comprising a precharge field-effect transistor associated with said bitline.

5. The column select multiplexer as recited in claim 1 further comprising a keeper field-effect transistor associated with said bitline.

6. The column select multiplexer as recited in claim 1 wherein said random-access memory array is a static random-access memory array.

7. A method of reading data from a bitcell of a random-access memory array, comprising:
   providing an inverted value in said bitcell from an inverter to a gate of a first field-effect transistor in a column select multiplexer;
   providing a column select signal to a gate of a second field-effect transistor in said column select multiplexer coupled in series with said first field-effect transistor; and
   employing said first and second field-effect transistors to impress a logical zero on an input of a latch in said column select multiplexer only when said first and second field-effect transistors are ON, wherein said inverter is not part of said latch.

8. The method as recited in claim 7 further comprising precharging said input to a logical one.

9. The method as recited in claim 7 further comprising employing said first and second field-effect transistors to impress a logical zero on an input of a NAND gate coupled to said input of said latch.

10. The method as recited in claim 7 further comprising precharging a bitline coupled between said bitcell and said gate of said first field-effect transistor to a logical one.

11. The method as recited in claim 7 further comprising precharging a read line coupled between said second field-effect transistor and said input of said latch to a logical one.

12. The method as recited in claim 7 wherein said random-access memory array is a static random-access memory array.

13. A memory subsystem, comprising:
   a memory controller;
   a first random-access memory array coupled to said memory controller;
   a second random-access memory array coupled to said memory controller; and
   a column select multiplexer coupled to said first random-access memory array and said second random-access memory array and including:
      a first field-effect transistor having a gate coupled through an inverter to a bitline of said first random-access memory array,
      a second field-effect transistor coupled in series with said first field-effect transistor and having a gate coupled to a column select bus of said random-access memory array, and
      a latch of said column select multiplexer having an input coupled to said first and second field-effect transistors, wherein said inverter is not part of said latch.

14. The column select multiplexer as recited in claim 13 further comprising a NAND gate coupled to said second field-effect transistor.

15. The memory subsystem as recited in claim 14 further comprising a field-effect transistor coupled between said NAND gate and said latch.

16. The memory subsystem as recited in claim 13 further comprising a precharge field-effect transistor associated with said bitline.

17. The memory subsystem as recited in claim 13 further comprising a keeper field-effect transistor associated with said bitline.

18. The memory subsystem as recited in claim 15 wherein said first random-access memory array and said second random-access memory array are arrays of static random-access memory.

* * * * *